(12) United States Patent
Aal et al.

(10) Patent No.: US 11,879,937 B2
(45) Date of Patent: Jan. 23, 2024

(54) METHOD AND DEVICE FOR MONITORING THE RELIABILITY OF AN ELECTRONIC SYSTEM

(71) Applicant: Volkswagen Aktiengesellschaft, Wolfsburg (DE)

(72) Inventors: Andreas Aal, Braunschweig (DE); Hosea Busse, Jena (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 406 days.

(21) Appl. No.: 17/280,544

(22) PCT Filed: Oct. 1, 2019

(86) PCT No.: PCT/EP2019/076659
§ 371 (c)(1),
(2) Date: Mar. 26, 2021

(87) PCT Pub. No.: WO2020/070169
PCT Pub. Date: Apr. 9, 2020

(65) Prior Publication Data
US 2022/0043056 A1 Feb. 10, 2022

(30) Foreign Application Priority Data

Oct. 1, 2018 (DE) ...................... 10 2018 216 863.6

(51) Int. Cl.
*G06F 11/00* (2006.01)
*G01R 31/317* (2006.01)
(Continued)

(52) U.S. Cl.
CPC ..... *G01R 31/3171* (2013.01); *G01R 31/2849* (2013.01); *G01R 31/31724* (2013.01); *G06N 20/00* (2019.01)

(58) Field of Classification Search
CPC ............ G01R 31/3171; G01R 31/2849; G01R 31/31724; G06N 20/00
See application file for complete search history.

(56) References Cited

U.S. PATENT DOCUMENTS 6,269,326 B1   7/2001 Lejeune
6,799,045 B1 *  9/2004 Brouwer ............. H04W 52/343
                                                  455/442

(Continued)

FOREIGN PATENT DOCUMENTS

DE     602004007525 T2    3/2008

OTHER PUBLICATIONS

PCT/EP2019/076659. International Search Report (dated Jan. 30, 2020).

(Continued)

*Primary Examiner* — Samir W Rizk
(74) *Attorney, Agent, or Firm* — Peter Zura; LOZA & LOZA, LLP

(57) ABSTRACT

Technologies and techniques for monitoring the reliability of an electronic system having one or more electronic components. A transmission quality of signals transmitted to or from the electronic system over a wired electrical signal transmission path are measured at different measurement times and according to a predetermined transmission quality measure. For each of the measurement times, the associated measured transmission quality is compared with a respective associated transmission quality reference value previously determined according to the transmission quality measure. A value of a reliability indicator associated with the respective measurement time is determined in dependence on the result of the associated comparison. In this regard, the transmission quality measure may be defined as a measure of the extent of a subrange of a one- or multi-dimensional operating parameter range of the electronic system in which, according to a predetermined reliability criterion, the electronic system operates reliably.

19 Claims, 4 Drawing Sheets

(51) Int. Cl.
    *G06N 20/00*     (2019.01)
    *G01R 31/28*     (2006.01)

(56)     References Cited

U.S. PATENT DOCUMENTS

| | | | |
|---|---|---|---|
| 2010/0256898 A1* | 10/2010 | Gassner | G08G 1/01 |
| | | | 701/117 |
| 2011/0133753 A1 | 6/2011 | Weitemeier et al. | |
| 2015/0061711 A1* | 3/2015 | Hamilton | G01R 31/2882 |
| | | | 324/750.05 |
| 2017/0343601 A1 | 11/2017 | Casatuta et al. | |

OTHER PUBLICATIONS

International Preliminary Report on Patentability (dated Mar. 21, 2021).

* cited by examiner

METHOD AND DEVICE FOR MONITORING THE RELIABILITY OF AN ELECTRONIC SYSTEM

RELATED APPLICATIONS

The present application claims priority to International Patent App. No. PCT/EP2019/076659 to Aal et al., filed Oct. 1, 2019, which further claims priority to German Pat. App. No. 10 2018 216 863.6 filed Oct. 1, 2018, the contents of each being incorporated by reference in their entirety herein.

TECHNICAL FIELD

The present invention relates to a method and an apparatus for monitoring the reliability of an electronic system, in particular a single electronic component, for example a semiconductor chip (e.g., system-on-chip, SOC), or an electronic system comprising a plurality of electronic components, such as a chipset or an assembly comprising a plurality of electronic components. In particular, the system to be monitored may be an electronic system intended for use in vehicle technology, in particular as a component of a vehicle, such as an automobile or motorcycle, or of a vehicle subsystem, such as a control unit (ECU).

BACKGROUND

In some applications, such electronic systems are subjected to requirements and stresses for which they were not originally developed. This can be the case, for example, when a semiconductor chip or chipset that can be used for a wide variety of different applications, such as a microcontroller or a chip for providing a communication interface, is installed in a vehicle and thus subjected to the associated harsh load requirements and operating conditions, particularly with regard to vibration, temperature range and temperature fluctuations and/or the usually aggressive chemical environment, e.g. in the engine compartment or an exhaust system of a motor vehicle. In this context, a vehicle is understood to be any movable object, in particular means of transport, which is suitable for transporting one or more persons, goods, actuators and/or sensors. The vehicle may also have flight characteristics or floating characteristics. In particular, a passenger car, a truck, a motorcycle, a bus, a bicycle or a trailer to one of the aforementioned vehicles is a vehicle in the sense of the invention. In particular, this also applies to the towing unit as well as the trailers of a train. Likewise, water vehicles, aircraft and space vehicles, in particular ships and boats, aircraft and flying drones as well as rockets and satellites are each vehicles within the meaning of the invention.

As a result, new failure mechanisms or a dominance shift of already existing failure mechanisms based on the operating concept for such electronic systems may thus arise, which may have a negative impact on their reliability, in particular long-term reliability. For example, solder joints, such as those used for the electrical connection (and in some cases also for the mechanical fastening) of electronic components on circuit boards, connection pins of electronic components, in particular external connections of chips, or conductor tracks on circuit boards (PCBs) can corrode and be subject to structural changes that can lead in particular to the formation of microcracks. Undesirable changes can also occur internally in components due to integrity, degradation or aging effects (e.g. delamination of layers, electromigration, etc.).

Such undesirable changes can in turn have an impact on signals and currents that have to be transmitted across the affected points. For example, a microcrack that has developed can act as an additional parasitic capacitance and thus influence the AC transmission behavior of the affected signal path so that signal transmission is disrupted. This in turn can lead to malfunctions, especially on the receiver side of such signal transmissions, for example if a chip receiving the signal has software running on a processor whose correct function depends on synchronous signal transmission according to a specific system clock. Other reliability problems can also occur as a result of the undesired changes mentioned, such as local overheating, and resulting therefrom, in particular thermoelastic, component or assembly deformations, reduced signal transmission or signal processing speeds, system parameter shifts or increased power consumption.

Approaches known today for reliability testing of electronic systems, in particular semiconductor chips, are generally based on testing one or more functionalities of the system or chip at one or more test times according to a defined test procedure to ensure that they function as specified. These well-known procedures include, in particular, so-called "boundary-scan test procedures", which are usually standardized procedures for testing digital and analog components in electronics. However, due to the complexity and smallness of today's circuit designs, it is becoming increasingly difficult to physically access certain points of a circuit. For this reason, among others, boundary-scan test procedures often do not provide the system- or application-specific test coverage, especially resolution depth, that is required.

In addition, these test procedures are often very time-consuming and thus costly, as well as being unsuitable for ongoing operation in the field as part of a self-test, especially a BIST (Build-in-Self-Test). Build-in-Self-Test means that an electronic component has an integrated test circuit which generates test signals and usually also compares them with predefined correct response signals so that the test result can be output to an automatic test equipment (ATE).

In order to close risky gaps in the test process both during manufacture and during qualification or field use, and thus to achieve the application-specific reliability requirements, a very high level of testing effort is usually required along the value chain already during component and assembly production up to the finished overall system (e.g. vehicle or vehicle subsystem, e.g. control unit) when using known test procedures. Without such test assurance already of the intermediate products, "compensation engineering" at system level (e.g. vehicle or subsystem thereof) is usually required, as far as possible, which in turn can be very complex and costly. In extreme cases, this high effort can even lead to certain innovative products (e.g. chips with high pin count ball-grid array (BGA) packages) not being selected as system components in the first place, although they would otherwise be particularly suitable for some applications, for example in the context of systems for highly automated or autonomous vehicles.

SUMMARY

Aspects of the present invention are to provide an improved solution for safeguarding the reliability of an electronic system. In particular, a solution is sought which can be used in the field of automotive engineering.

Aspects of a method and an apparatus are described below in connection with the independent patent claims. Further advantageous embodiments are shown in the dependent claims as well as in the description and the figures.

In some examples, a method is disclosed, in particular a computer-implemented method, for monitoring the reliability of an electronic system. The method comprises: (i) repeatedly measuring, at different measurement times and according to a predetermined transmission quality measure, a transmission quality of signals transmitted to or from the electronic system over a wired electrical signal transmission path; (ii) comparing, for each of the measurement times, the associated measured transmission quality with a respective associated transmission quality reference value previously determined according to the transmission quality measure; and (iii) determining a value of a reliability indicator associated with the respective measurement time in dependence on the result of the associated comparison. In this regard, the transmission quality measure is defined as a measure of the extent of a subrange of a one- or multi-dimensional operating parameter range of the electronic system in which, according to a predetermined reliability criterion, the electronic system operates reliably.

An "electronic system" within the meaning of the present disclosure is to be understood as a single-component or multi-component system which has at least one electronic device as a component. In particular, individual electronic devices, for example of a semiconductor chip (e.g., system-on-chip, SOC), or electronic systems comprising at least one electronic device, such as a chipset or an assembly comprising a plurality of electronic devices, are each electronic systems within the meaning of the present disclosure. The electronic system may in particular be a system intended for use in vehicle technology, in particular as a component of a vehicle, such as an automobile or motorcycle, or of a vehicle subsystem, such as a control unit (ECU).

In particular, the "repeated measurement" can be implemented as a continuous measurement or as multiple point- or time-segment-wise measurements at different successive discrete measurement times or measurement time ranges.

The wired electrical signal transmission path can run in particular between two or more electronic components, in particular semiconductor components, e.g., integrated circuits (IC), of which at least one component is itself part of the electronic system to be monitored. It can thus run in particular within the system between various of its system components. In particular, the signal transmission path may run at least partially via one or more conductor tracks on one or more printed circuit boards (PCB) and or solder joints. It may also be formed by means of direct contacting between the components, for example by means of a so-called flip-chip connection, in which two or more chips are arranged directly on top of one another and are thereby electrically connected to one another via at least some of their connection contacts (pins). In other embodiments, however, the transmission path can also run as a loop connection between an output and an input of the same system component (closed-loop). In addition, in each of the above cases, one or more further components, in particular electronic devices, such as passive or active devices or entire circuits, e.g. ICs, may be provided as intermediate nodes in the transmission path.

The transmission quality is measured according to the predetermined transmission quality measure. This means—in analogy to measuring a distance with a meter—that the transmission quality is determined with the predetermined transmission quality measure as a "scale" in the figurative sense. The transmission quality measure is defined as a measure of the extent of a subrange of a one- or multi-dimensional operating parameter range of the electronic system in which the electronic system operates reliably according to a predetermined reliability criterion. The operating parameter range is here a one- or multi-dimensional range of values for correspondingly one or more operating parameters of the system.

The operating parameter(s) may be, in particular, technical parameters that are a characteristic, in particular a level and/or a phase, of the signal transmitted to or from the electronic system. The reliability criterion may be applied to each of a plurality of operating points of the operating parameter range, thereby determining whether sufficient transmission quality exists for that particular operating point and thus whether the system "operates reliably" in the above sense at that operating point. In particular, the reliability criterion can be defined on the basis of a threshold for a transmission error rate, e.g., a bit error rate (BER), and determine, for example, that reliable operation is present at the operating point under consideration if the transmission error rate is below a predetermined error threshold, which in particular can also be zero.

However, the above-mentioned test of the transmission quality related to a specific operating point on the basis of the reliability criterion is not to be confused with the higher-level transmission quality measure. The latter is in fact defined on the basis of a certain extent of that part of the operating parameter range which is determined by the operating points with sufficient transmission quality in each case according to the reliability criterion and includes these operating points in the operating parameter range. In particular, the extent may refer to the N-dimensional "volume" of the subrange, where N is a natural number corresponding to the dimension of the operating parameter range. Instead, the extent may also refer to a "volume" of smaller dimension $M<N$. For example, for $N=3$, the extent may refer as the size of a two-dimensional area or as the length of a one-dimensional distance, each bounded by the limits of the subrange. Thus, in the one-dimensional case $M=1$, the extent may be defined in particular as a diameter of the subrange. In the case of $N>3$, on the other hand, the volume considered to determine the extent of the subrange can also have a dimension $M>3$.

in some examples, configurations are disclosed to provide the capability of determining not only at a given measurement time whether the system to be monitored is at that time in a fault-free or, in any case, in an uncritical or permissible operating state within the scope of its specification. Rather, it is additionally able to determine, over a longer period of time and already at a time when the system to be monitored is still functioning properly, its reliability and its change over time and even to make useful predictions about the expected remaining sufficiently safe operating time or sufficiently safe usable lifetime of the system. In particular, it is now possible to detect at an early-stage properties of electronic components or electronic devices that could not be detected with previously known test methods, or that could not be detected sufficiently early before the occurrence of a functional fault. In particular, integrity, degradation or aging effects inside (e.g., delamination of layers, electromigration, etc.) and outside (e.g., solder joints) of these electronic components can be detected and diagnosed at an early stage, which could later lead to the disturbance of electrical or thermal contact properties and signal transmission characteristics.

In addition, by comparing the associated measured transmission quality with a respective associated transmission quality reference value previously determined in accordance with the transmission quality measure, it can be determined at each of the measurement times whether the system has now reached an operating state at which intervention, such as replacement or repair of the system or parts thereof, is beneficial or even required in order to continue to ensure its operational reliability.

In some examples, the method can be used not only during the runtime of the system to be monitored when it is deployed in the field, but also during its production and qualification or final testing prior to deployment. In this way, improved risk management processes can be achieved, which in particular can also include the fields of development, production, qualification and supply chain, and thus achieve a consistent safeguarding process in this respect. In this way, risks can be made transparent at an early stage, particularly when using the latest semiconductor technologies, as well as sophisticated packaging technologies for these, and when using passive electronic components, so that appropriate measures can be taken at an early stage along the design hierarchy. Without these aspects or the resulting measures, the very safety-relevant automotive safety chain in particular would be at least partially interrupted—regardless of compliance with existing standards.

Preferred embodiments of the method are described below, which can be arbitrarily combined with each other or with other aspects of the present disclosure as further described, unless such combination is explicitly excluded or technically impossible.

Other aspects of the present disclosure relate to an apparatus for monitoring the reliability of an electronic system, the apparatus being configured to perform the processes disclosed herein. In particular, the system may be processor-based and thus capable of executing the processes by means of a computer program implementing it in whole or in part. In particular, the device may be a control unit for a vehicle, such as an automobile or motorcycle.

Other aspects of the present disclosure relate to a computer program comprising instructions that, when executed on one or more processors associated with an apparatus, cause the apparatus to perform the processes disclosed herein.

For example, the computer program can be stored on a non-volatile, tangibly-embodied, data carrier. Preferably, this is a data carrier in the form of an optical data carrier or a flash memory module. This may be advantageous if the computer program as such is to be traded independently of a processor platform on which the one or more programs are to be executed. In another implementation, the computer program may be present as a file on a data processing unit, particularly a server, and downloadable via a data connection, such as the Internet or a dedicated data connection, such as a proprietary or local area network. In addition, the computer program may have a plurality of interacting individual program modules.

Accordingly, an apparatus of the present disclosure may comprise a program memory in which the computer program is stored. Alternatively, the apparatus may also be configured to access a computer program available externally, for example on one or more servers or other data processing units, via a communication link, in particular in order to exchange data therewith which are used during the course of the method or computer program or represent outputs of the computer program.

The features and advantages explained with respect to aspects of the present disclosure apply accordingly to the other aspects of the present disclosure.

Further advantages, features and possible applications of the present disclosure will be apparent from the following detailed description in connection with the figures.

DETAILED DESCRIPTION

Figure 1:
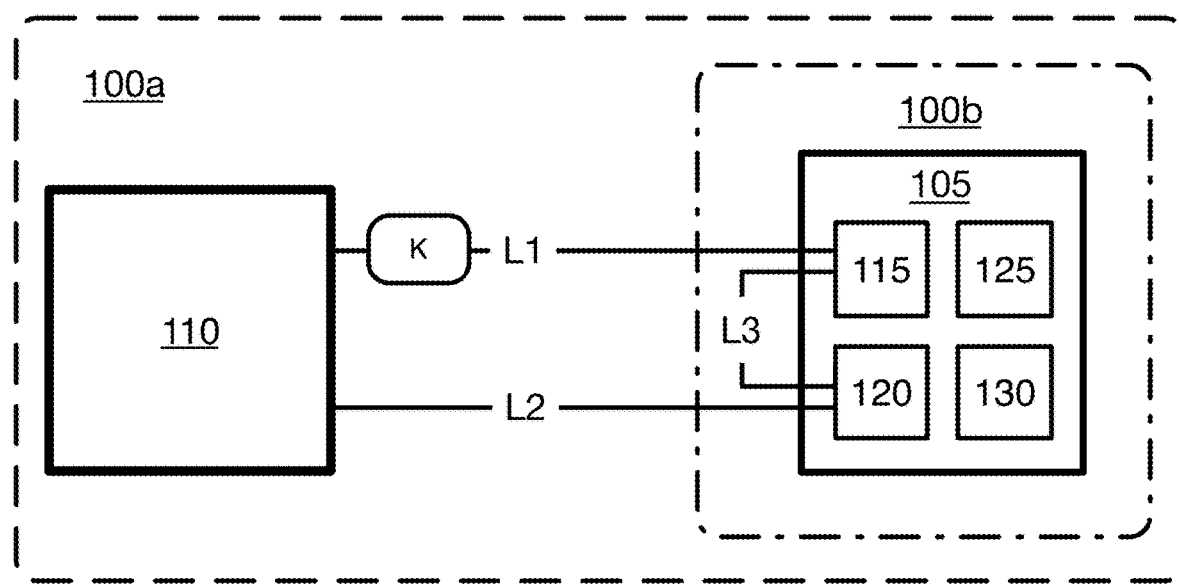
FIG. 1 schematically illustrates an exemplary embodiment of an electronic system to be monitored, which at the same time represents an exemplary apparatus under some aspects of the present disclosure.

Throughout the figures, the same reference signs are used for the same or corresponding elements of the present disclosure.

In various examples described herein, the signals transmitted over a transmission path are radio frequency signals (e.g., signals with at least one spectral component in the kilohertz range or higher), for example, digital signals with data transmission rates in the GBaud range. This has the advantage that any existing impairments or defects of the transmission path, such as microcracks at solder joints or thermoplastic component housing deformations, which are often dependent on aging or damage and have an effect on the capacitive properties of the transmission path or its impedance (and thus in particular on the imaginary part of the complexly represented signal) as a corresponding change in the latter and thus also in the resulting frequency spectrum of signals transmitted via the transmission path, can be detected well in the course of the repeated measurements.

In some examples, the reference values for the transmission quality may be defined as constant values, so that the same reference value applies for all measurement times. In alternative embodiments, on the other hand, the reference value can be defined as time-dependent, in particular as a function of the measurement time, and thus its temporal value progression can be adapted to an expected aging curve of the system, for example. In this way, the safety requirements determined by means of the reference value can be made variable over time and, in particular, can be made increasingly more stringent with increasing age or operating time of the system in order to always be able to ensure the required operational safety.

According to some embodiments, the transmission quality measure may be defined, where
(a) in the case of a one-dimensional operating parameter range, as a function of at least one of the following: (i) an extent of the subrange within the operating parameter range; (ii) the ratio of an extent of the subrange within the operating parameter range to a specified maximum extent of the operating parameter range;

(b) in the case of a multi-dimensional operating parameter range, as a function of at least one of the following: (i) the ratio of an at least two-dimensional extent of the sub-range to the corresponding specified extent of the entire operating parameter range or a defined section thereof; (ii) an extent of the sub-range along an extension direction determined by a selected single dimension of the operating parameter range or along an extension direction determined by a linear combination of a plurality of its dimensions; (iii) the ratio of an extent of the sub-range along an extension direction determined by a selected single dimension or along an extension direction determined by a linear combination of multiple dimensions of the operating parameter range to a specified maximum extent of the operating parameter range along that extension direction; or (c) as a function of a transmission quality measured for one or more selected individual operating points within the operating range or a predetermined section thereof in each case and is evaluated in particular in accordance with the predetermined reliability criterion, which transmission quality can be determined in particular on the basis of a transmission error rate, e.g. BER.

To the extent that the dimension of the operating parameter range coincides with that of the subrange in the aforementioned embodiments, these embodiments can advantageously be used to determine the reliability of the electronic system as a function of all dimensions of the operating parameter range. Otherwise, however, e.g., if the dimension of the sub-range is less than that of the operating parameter range, this can be used to specifically address, in particular determine, individual aspects of the reliability.

If, for example, there is a two-dimensional operating parameter range in which a first operating parameter represents a level of the signal transmitted via the transmission path and a second operating parameter represents an associated phase of the signal, then in the case of equal dimensions of the operating parameter range and the subrange the entire area of the then two-dimensional subrange can be used to determine the transmission quality measure, which thus depends on both the signal levels and the signal phases at the operating points located in the subrange and in this sense represents a comprehensive measure. On the other hand, in the case of a smaller dimension of the subrange, e.g., in the present example a one-dimensional subrange, which, for example, only concerns the signal phases, the reliability aspect with regard to this dimension (here e.g., the phase fidelity or variance) can be measured specifically and used for the selective determination of the transmission quality measure in this sense.

When using such aforementioned embodiments, in which the extension of the subrange is determined along an extension direction not coinciding with a single dimension, e.g., in the case of using the above-mentioned linear combinations for determining the extension direction, the various dimensions participating in the respective linear combination can all be taken into account at the same time, whereby depending on the exact direction of the extension direction within the operating parameter range, for example, depending on the respective weight factors of the summands within the linear combination, any desired weighting of the individual dimensions participating in the linear combination can be set, for example, in dependence on the respective weight factors of the summands within the linear combination, where any desired weighting of the individual dimensions involved in the linear combination can be set in a targeted manner, which makes it possible in particular to detect special error patterns dependent on several dimensions.

In some examples, the transmission quality measure may be additionally defined as a function of at least one parameter characterizing the location of the subrange within the operating parameter range. In this way, in particular, the determination of the reliability according to the reliability indicator can take into account whether the subrange is symmetrically or asymmetrically located within the operating parameter range according to a defined reference point or reference direction. Thus, the sub-ranges can be defined, in particular, as axial sections along one dimension or as sections on another extension direction defined by means of one of the above-mentioned linear combinations. Referring again to the example given above, in which one of the operating parameters and thus one of the dimensions of the operating parameter range relates to the phase of the transmitted signal, this could be used, for example, to determine whether the subrange is symmetrical with respect to positive and negative phase shifts with respect to a zero point of the phase shifts, or whether one of the two phase shift directions is more or less affected by a change in reliability. Using the aforementioned concept of axial sections, it would also be possible instead to specifically consider only the reliability or its change over time with respect to only positive or, alternatively, only negative phase shifts. Multilateral truncations of the subrange would also be conceivable, for example by truncating it on all sides or with respect to at least one specific direction of expansion in such a way that only a limited range of values within the original subrange determined on the basis of the reliability criterion is considered and defined as a (new) subrange. For example, in the example mentioned, the subrange could be trimmed or limited, to a certain selected phase range located within the original subrange along the phase dimension of the operating parameter range.

In some examples, the transmission quality may be determined by means of the transmission quality measure as a function of data representing a Shmoo diagram spanning the operating range and the subrange therein. In particular, the transmission quality to be measured for the respective measurement time can be determined as a function of the value of at least one parameter representing a certain at least approximately determined extent of the subrange within the Shmoo diagram.

A "Shmoo plot" is a graphical representation of the behavior of a component or system as it varies over a range of conditions or inputs, particularly as in electrical engineering. Shmoo plots are often used to show the results of testing complex electronic systems such as computers or integrated circuits such as DRAMs, ASICs or microprocessors. In particular, the plot shows the subset of conditions or operating points within its range of operating parameters under which the system under test operates reliably while meeting its relevant specifications. For example, in a test of electronic systems in the form of or involving semiconductor memories, voltages, temperature, and refresh rates of the semiconductor memories may be varied as their operating parameters over certain ranges, but only certain operating points, i.e., combinations of these factors, will permit reliable operation of the device. Recorded on independent axes (e.g., voltage, temperature, refresh rates), the reliable operating value range, referred to herein as a "subrange,"

encloses a three-dimensional, usually irregularly shaped volume in the present example.

Thus, in these embodiments, for example in the two-dimensional case, an area of the subrange within the Shmoo diagram can be determined at least approximately on the basis of the data representing it, for example by counting the operating points located in the subrange. The size of the entire, in particular specified, operating parameter range under consideration can also be determined in the same way.

In some examples, for each measurement time, the respective measurement of the transmission quality comprises measuring a respective transmission error rate, which may be expressed in particular in terms of a bit error rate (BER or BFR) or a bit error ratio or quotient (BFV or BFQ), with respect to a digital signal transmission over the signal transmission path for a plurality of operating points within the specified multi-dimensional operating parameter range. In addition, the transmission quality for the respective measurement time is determined on the basis of the associated transmission error rates thus measured. The transmission quality measure based on a specific extent of the subrange can thus be determined in particular by determining the corresponding extent of the subrange on the basis of the number of those operating points whose respective transmission error rate is below a predetermined error threshold, which in particular can also be zero. Instead of the number of operating points, the partial volume of the operating parameter range spanned by these operating points and corresponding in its dimension to that of the subrange can in particular also be used to determine the extent.

In some examples, the comparison of the transmission quality measured at a respective measurement time with an assigned respective reference value for the transmission quality determined beforehand in accordance with the transmission quality measure is performed in such a way that the transmission quality measured at the respective measurement time is included in the comparison in the form of a mean or median value which results from an averaging or median formation on the basis of this measured transmission quality and at least one transmission quality measured at an earlier measurement time with respect to the transmission path. These transmission qualities were determined in each case in accordance to the transmission quality measure. This type of comparison is a particularly easy way of implementing the method, e.g., in particular with low complexity, which has a smoothing effect with regard to short-term fluctuations in the transmission quality and can thus be used to increase the robustness of the method with regard to such fluctuations in the measurement results for the transmission quality, which are often attributable to only temporary disturbances external to the system.

In some embodiments, the respective reference value associated with one or more measurement times is determined as a function of at least one of the operating parameters, in particular based on a value thereof that is present at the respective measurement time, cumulative or averaged over the past or at least a portion thereof. Thus, the reference value can be determined in particular as a function of the temperature, the humidity, the current consumption, a supply voltage, a signal level or a signal phase of the transmitted signal, or a vibration to which the electronic system is subjected.

Taking temperature or humidity as an example, the reference value can thus also be determined in particular as a function of an (anticipated) location or geographical region where the electronic system is located and thus of the climate prevailing there. If, for example, a certain climate favors corrosion or other harmful influences on the electronic system, the reference value could be set to correspond to a higher level of safety with respect to the reliability of the electronic system, so that it is reached more quickly than when the system is operated in climatic zones that are less critical in comparison. In the case of vehicles, for example, it is conceivable that regional variants of the same vehicle type are provided with different reference values or reference value curves in order to be able to take into account the different climatic conditions associated with the different regions.

A time-dependent determination of the respective reference value as a function of cumulative mechanical or electrical loads of the electronic system that have occurred so far, for example due to vibration or electrical load or a number of startup (boot) processes that have occurred or the age of the system or a component thereof involved in the transmission, can also be achieved in this way in order to optimize overall the reliability monitoring performed by the method, in particular from a safety-relevant point of view.

In some examples, the operating parameter range may include, each as a dimension, at least one of the following operating parameters: (i) an operating parameter characterizing a signal level of a signal transmitted via the transmission path; (ii) an operating parameter characterizing a signal phase of a signal transmitted via the transmission path; (iii) an operating parameter characterizing an operating temperature of the electronic system or of the transmission path; (iv) an operating parameter characterizing an aging condition of the electronic system or of the transmission path; (v) an operating parameter characterizing one or more external influences or impacts to which the electronic system is exposed. Such influences or impacts can be caused in particular by vibration, mechanical shock, mechanical, electrical or magnetic impacts, for example by a printed circuit board or housing structure interacting with the system. The influences or impacts may in particular be an ambient temperature, humidity or chemical air composition, or compressive or tensile forces or electric or magnetic fields acting on the system. What all these specific operating parameters have in common is that they typically exhibit a pronounced correlation with the reliability of the associated electronic system and are thus particularly suitable as indicators or measured variables on the basis of which the reliability of the electronic system can be determined or estimated.

In some examples, the reference values for the transmission quality are determined at different measurement times prior to the determination of the subrange under specific reference conditions, for example by running through a plurality of successive predefined temperature cycles, and are stored in a data structure within a, preferably nonvolatile, memory device for subsequent comparison with the results of the repeated measurement of the transmission quality. In particular, the memory device can be provided as part of the electronic system to be monitored itself, which in particular enables offline use or correspondingly self-sufficient process implementation. The data structure may in particular be one that represents a value table, in particular a so-called lookup table (LUT). The reference values stored in the data structure can in particular also be stored grouped according to one or more operating parameter values, for example in such a way that the reference values determined for a particular operating temperature are stored in a group. The grouped storage can refer in particular to the physical or logical addressing in the memory device or to the software-based access option, e.g., as part of an indexing of data fields in the data structure.

In some examples, the respective value of the reliability indicator is determined to indicate sufficient reliability or lack of reliability depending on the result of the comparison. In this case, the reliability indicator directly provides a statement about the reliability of the system related to the last measurement time.

In some of these embodiments, the determination of the respective value of the reliability indicator is performed based on a test criterion that is dynamically adapted depending on a plurality of previously determined values of the reliability indicator or, as the case may be, of the resulting reliability indicator. For example, the test criterion can be tightened dynamically if, on the basis of the respective previously determined values of the reliability indicator or the resulting reliability indicator, an increasing aging of the monitored system or unexpected fluctuations of these values occur which could indicate a developing defect.

The dynamic adaptation of the test criterion can be carried out in particular within the context of machine learning on the basis of the previously determined values of the reliability indicator or, as the case may be, of the resulting reliability indicator. Thus, not only an automation of the dynamic determination of the test criterion can be achieved, but also an improved performance of this adaptation with regard to an early and more reliable detection of developing disturbances or defects, in particular with complex temporal progressions of the value of the reliability indicator.

In some examples, the value of the reliability indicator is determined as a function of a deviation, determined during the comparison, of the respective transmission quality measured according to the transmission quality measure from the associated respective reference value based on one of the following test criteria: (i) if the deviation determined on the basis of the comparison does not fall below a predetermined fixed value for the minimum deviation, the value of the reliability indicator is set to indicate sufficient reliability and otherwise a lack of reliability; (ii) if the deviation determined on the basis of the comparison does not fall below a value for the minimum deviation defined as a function of the measurement time, the value of the reliability indicator is set to indicate sufficient reliability and otherwise lack of reliability; (iii) if the respective measurement time is before the time of reaching a predetermined aging state of the electronic system, the value of the reliability indicator is set to indicate sufficient reliability and otherwise a lack of reliability. In particular, the value of the reliability indicator can be determined as a function of an absolute value, a value related to a reference deviation, or a value of the respective deviation averaged over a time range, and thus in a simple manner.

According to test criterion (i), a temporally constant reliability threshold can thus be used, which refers either to a temporally invariant reference value or to a temporally variable, in particular measurement time-dependent, reference value. Thus, based on the reference value curve and the fixed reliability threshold, in particular a fixed value threshold or a value threshold that moves with the time-variable reference value and is thus also time-variable can be established as a reliability limit. According to test criterion (ii), the reliability threshold itself is variable instead or cumulatively, which can also be used in conjunction with a temporally constant or variable reference value to define a temporally variable value threshold as a reliability limit. The test criteria (i) and (ii) can thus be used advantageously, in particular, when it is a question of defining around the temporal course of the reference value a range of values running in a band-like manner over time, which corresponds to a lack of reliability, while reliability values outside the band correspond to a sufficient reliability, i.e. to a system operating reliably according to the reliability criterion.

Test criterion (iii), on the other hand, defines a hard age limit with respect to a predetermined aging condition of the electronic system. The aging condition can be defined in various ways, for example on the basis of the absolute age, an accumulated total operating time, a number of successful start-ups or any other predetermined aging-dependent property or operating history of the system or a component thereof involved in the signal transmission.

In some examples, at least one electronic component is arranged in the transmission path and the determination of the transmission quality at the respective measurement time is performed depending on the type of the at least one component. Thus, even due to the presence of at least one component, more complex transmission paths can be used to monitor the reliability of the electronic system. This can be particularly helpful if monitoring on the basis of a component-free transmission path is not possible, or if it is desired anyway to use such a more complex transmission path as a whole for monitoring reliability and thus to take into account an extended range of possible causes of faults. In particular, passive components, such as capacitors and resistors (also so-called "zero SI" resistors with negligible ohmic, e.g., real-part related, resistance value), or also active components or circuits containing such components (for example ICs) can be considered as such components located in the transmission path. The reference values are accordingly determined specifically for the type and arrangement of the component(s) in the transmission line.

In some examples, the method is further applied to determine a respective further reliability indicator for the measurement times based on a repeated measurement of the transmission quality according to the predetermined transmission quality measure of signals transmitted to or from the electronic system via a second signal transmission path different from the first signal transmission path. In addition, a resulting reliability indicator at the respective measurement time for the electronic system or at least one of the transmission paths is determined as a function of the reliability indicator determined for the first transmission path for the respective measurement time and the further reliability indicator determined for this respective measurement time for the second transmission path.

In this way, it is possible to monitor the reliability of the electronic system on the basis of a reliability measurement of two or more different transmission paths and thus to increase the overall robustness of the method. In particular, it is thus possible in many cases to distinguish system-internal defects or faults which have their cause in the transmission path or one or more components of the system itself from faults which have an external cause and occur, for example, by means of electromagnetic coupling of interference signals, in particular only temporarily. Such a distinction is possible in particular if the reliability curve with respect to the two or more different transmission paths is clearly different, so that it can be assumed that a subset of the transmission paths is subject to an external disturbance, while this is not the case for the subset of the transmission paths formed by the other transmission path.

In some examples, the method may further include triggering an action of the electronic system itself or an action of another entity acting thereon when, according to the determined value of the reliability indicator or, as the case may be, the resulting reliability indicator, the electronic system is no longer sufficiently reliable. For example, a fault indication of the system could be triggered, or the system could be switched to a safe operating mode by itself or by another entity, such as a power supply device or a control unit in communication with the system. In this way, a reliability problem detected in accordance with the method can be responded to appropriately and at an early stage in order to be able to prevent subsequent damage caused by a lack of reliability in advance. For example, maintenance or replacement of the electronic system, the transmission path(s) or individual parts or components thereof can be carried out in good time.

Figure 2:
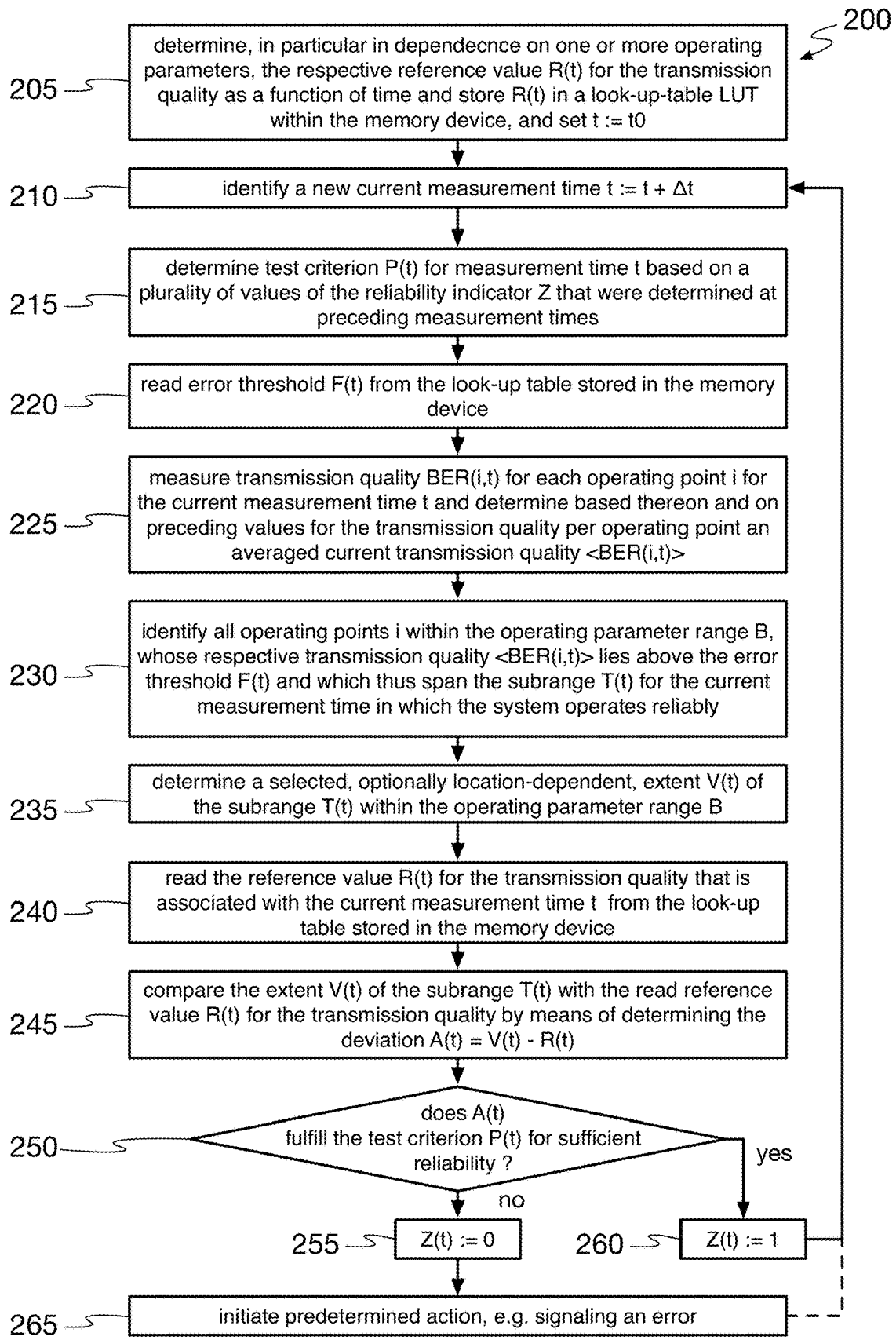
FIG. 2 schematically shows a flow chart illustrating a preferred embodiment of the method under some aspects of the present disclosure.

In some examples, the system 100a to be monitored, illustrated in FIG. 1, includes a first semiconductor integrated circuit 105 and a second semiconductor integrated circuit 110 as components and system components, respectively. Here, the two semiconductor circuits 105 and 110 may be connected to each other via two different electrical line-based signal transmission paths L1 and L2 and can exchange electrical signals, in particular digital signals, via them. The semiconductor circuit 105 has corresponding communication interfaces 115 and 120, respectively, for this purpose. Similar things can apply accordingly to the semiconductor circuit 110 (not shown). The communication interfaces 115 and 120, as well as their respective counterparts at the other end of the respective transmission path, may in particular be designed in accordance with a known communication technology, for example in accordance with the PCI Express (PCIe) standard. In the signal transmission path L1, a further electronic component K, for example a resistor or a capacitor, is also provided as a component. In addition, the two communication interfaces 115 and 120 are interconnected via a signal transmission loop L3, via which signals, in particular digital signals, can also be transmitted. The semiconductor circuit 105 also has a processor 125 and a memory device 130 in which, in particular, a computer program that can run on the processor 125 for implementing the method according to the present disclosure (for example, as shown in FIG. 2) and data required for this purpose, such as a lookup table LUT, can be stored.

The components of the system may be configured on a circuit board (not shown) and are mechanically and electrically connected to it by means of corresponding solder joints on associated conductor tracks of the circuit board.

Instead of the overall arrangement 100a, only the semiconductor circuit 105 can alternatively be regarded as the system 100b to be monitored. The system 100a or 100b is thus capable of monitoring itself with respect to its reliability by means of the method according to the present disclosure in the sense of a self-test, so that it simultaneously represents a possible embodiment of the device according to the present disclosure.

In the following, with reference to FIGS. 2 to 5, an exemplary embodiment of the method 200 according to the present disclosure illustrated in FIG. 2, which can be used in particular for monitoring a system 100a or 100b according to FIG. 1, will now be explained. Accordingly, exemplary reference is made herein to a system according to FIG. 1. In this example, the operating parameter range B is defined in two dimensions with the signal level expressed by a signal voltage U and the associated signal phase Φ as dimensions (cf. FIG. 3). Any of the transmission paths L1, L2 or L3 can be used for reliability monitoring, optionally more than one of them, especially in combination.

The flow of the method 200 may be divided into three sequential phases, with a first phase being a preparatory phase that may be run only once and that includes a preparatory process or step 205 (the terms "process" and "step" are used herein as synonymous, and may refer to a single action or a plurality of actions combined into a process, depending on the context).

As part of this preparatory process 205, the values for a time-dependent reference value R(t) for the transmission quality determined according to a defined transmission quality measure are defined and stored in a lookup table LUT in the memory device 130 of the semiconductor circuit 105. The determination of the time history of the reference value, and thus of said values, may be performed in particular to test the fault susceptibility of the system 100a or 100b by performing the second phase of the method described below under well-defined test conditions to generate a data set representing an initial version of the Shmoo diagram shown in FIG. 3 for an initial time t1 in the life of the system. From this data set, a value V(t1) for an initial reliability is then determined, as will be described in detail below for later measurement times.

At the same time, the shape, size and position of a minimum sub-range D of the operating range B required for proper operation of the system 100a or 100b is known (cf. FIG. 3), for example from the specification of the system or previously known, in particular application-specific, performance requirements. The same applies to a transition range C, which is located between the subrange T and the outer part of the operating parameter range B in which the system does not operate reliably or even fails due to an excessively high statistical frequency for the occurrence of transmission errors. In the transition range C, the statistical frequency for the occurrence of transmission errors and any resulting system failure is higher than in the subrange T but lower than in the outer part of the operating parameter range B, so that sufficiently reliable transmission could still be achieved here if necessary using sufficient error correction measures. It would therefore be conceivable to extend subrange T to include transition range C if such sufficient error correction measures were used. However, such an extension will not be considered in the following.

The reference value R(t1) is now selected so that it would correspond in the Shmoo diagram to a closed curve or area which, on the one hand, completely envelops the minimum subrange and, on the other hand, runs completely in the subrange T spanned by the operating points in the operating parameter range B of the system at which the system operates faultlessly and reliably at time t1.

Starting from this reference value R(t1), a desired time course R(t) can then be defined. In particular, the reference value R can also be defined as a constant (cf. FIG. 4: R1(t)=R1=const.). Instead, the reference value R(t) can also be defined as time-varying, in particular in such a way that its representation in the Schmoo diagram corresponds to an increasing, optionally also stepped, contraction around the minimum subrange D, but without falling below it (cf. FIG. 4: R2(t), D). The reference value can be determined in particular as a function of one or more selected operating parameters, such as an ambient temperature, in particular if it is to be expected that the subsequent time characteristics of the transmission quality V(t) measured according to the transmission quality measure depend on this or these selected operating parameters, as illustrated by the example of a temperature dependence in FIG. 5.

After step or process 205, which in particular can still be carried out at the factory, the second phase of the method begins, in which the actual monitoring of the system takes place, for example during its use in the field. In a step 210, a new current measurement time t is first determined for this purpose, which can be done in particular by incrementing (t:=t+Δt) a previous measurement time. The value t can be used in particular as a time index to index different successive, but not necessarily equidistant, measurement times. In the present example, however, the above-mentioned incrementation is used, resulting in equidistant measurement times t1, t2, . . . , t10.

In a further step 215, an associated test criterion P(t) is determined for the current measurement time t. If available, this is done on the basis of a plurality of values of the reliability indicator Z(t) determined in each loop-shaped run of the second phase of the method in steps 255 and 260, respectively, at preceding measurement times. Then, in a step 220, an error threshold F(t) associated with the current measurement time is read out from the lookup table LUT stored in the memory device 130. This error threshold can in particular be defined as a fixed value or value progression ab initio in the lookup table LUT, or it can likewise be defined only in the context of step 205 of the preparation phase, in particular on the basis of the results of the transmission quality measurements performed there at the various measurement points WP, and written to the lookup table LUT.

Now, in a step 225 for the current measurement time t, the actual measurement of the reliability of the system 100a or 100b can begin. For this purpose, in step 225 the system is tested successively at each operating point from a set of predetermined operating points WP (cf. FIG. 3) in the operating parameter range of each system, which are indexed here by the index i for the purpose of illustration, and a corresponding associated transmission quality is measured in the form of a bit error rate BER(i, t). Optionally, as illustrated in FIG. 2, an averaged "current" transmission quality, expressed by the averaged bit error rate <BER(i, t)>, can be calculated from this as well as from bit error rates determined in previous runs of the second phase of the method at this respective operating point i.

Now, in a further step 230, all operating points i in the operating parameter range B are identified whose respective current averaged transmission quality <BER(i, t)> lies above the error threshold F(t) assigned to the current measurement time t. These operating points i thus span the current subrange T(t) of the operating parameter range B in which the system 100a or 100b, respectively, operates reliably.

Figure 3:
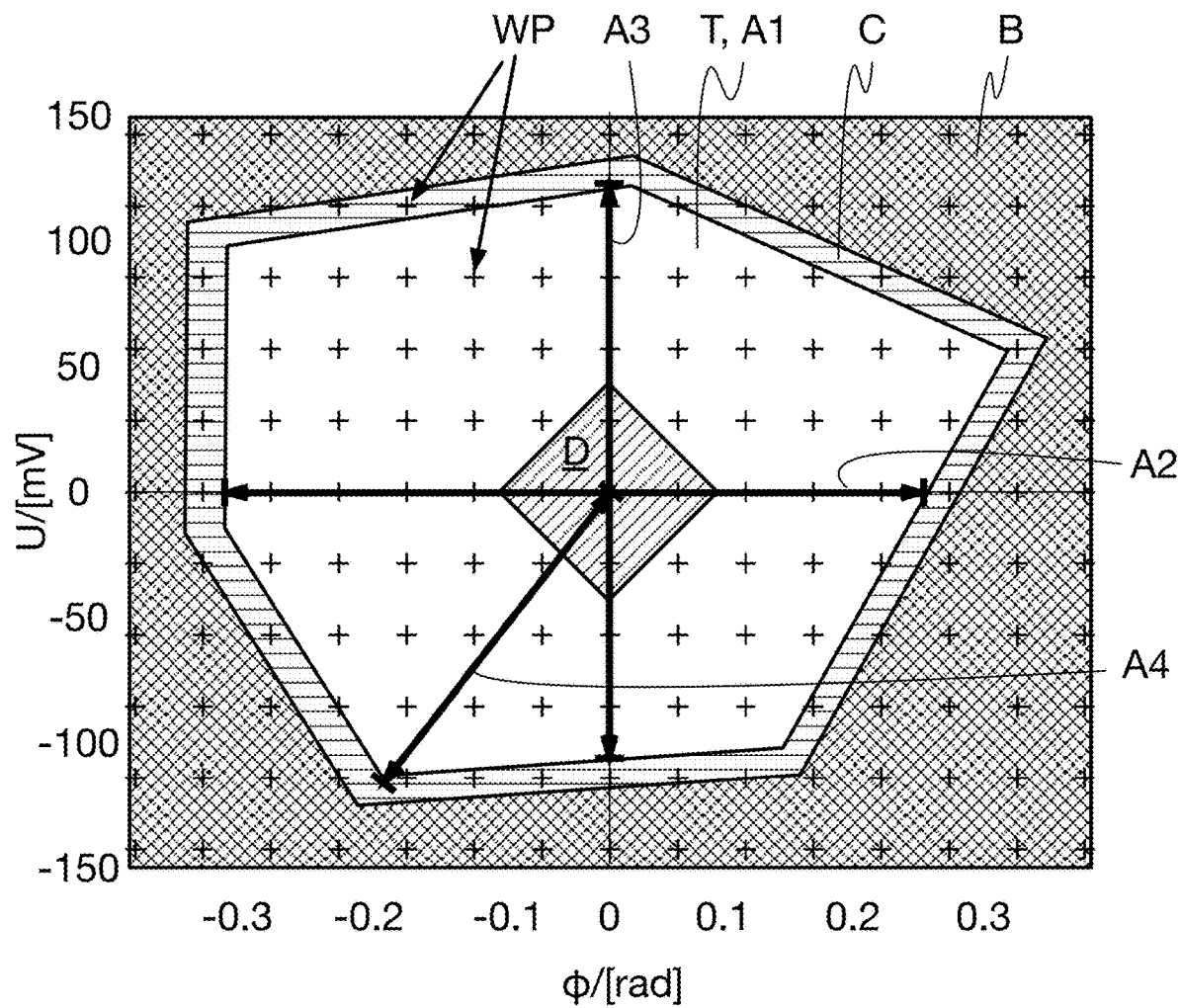
FIG. 3 illustrates an example shmoo diagram over a multidimensional operating range of the electronic system under some aspects of the present disclosure.
Figure 4:
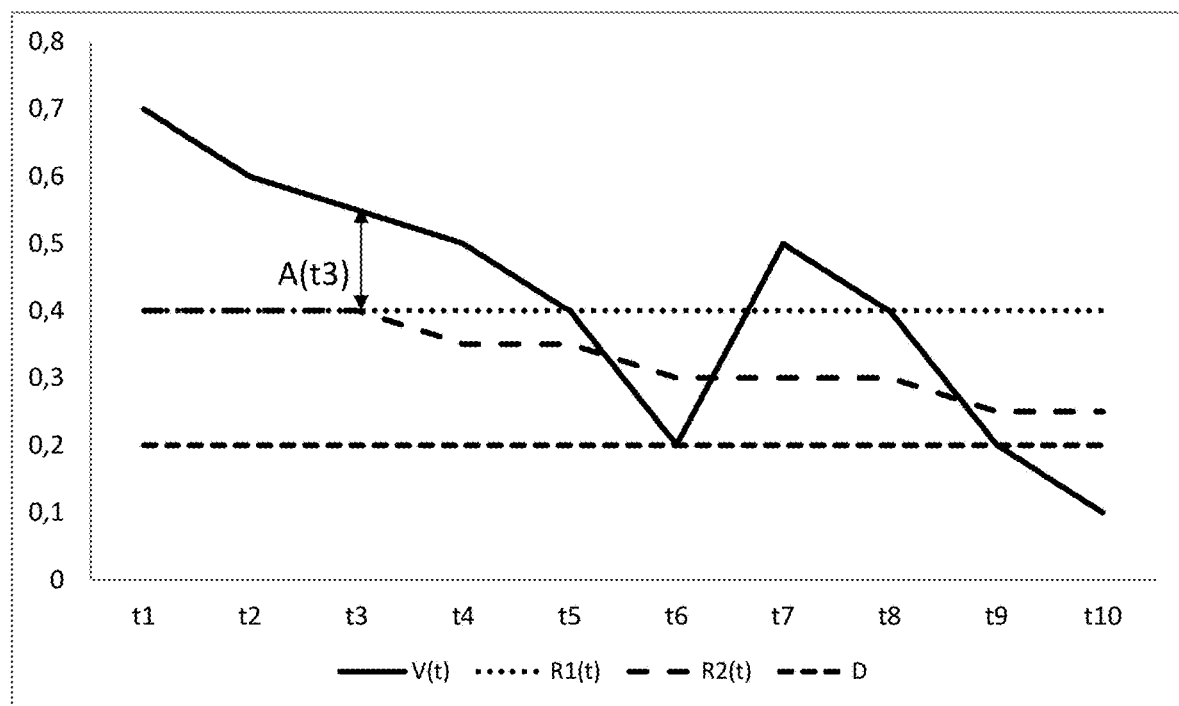
FIG. 4 illustrates an exemplary characteristic curve for the transmission quality of the system determined according to the transmission quality measure from an extent of the subrange, as well as two exemplary characteristic curves for the reference value under some aspects of the present disclosure.
Figure 5:
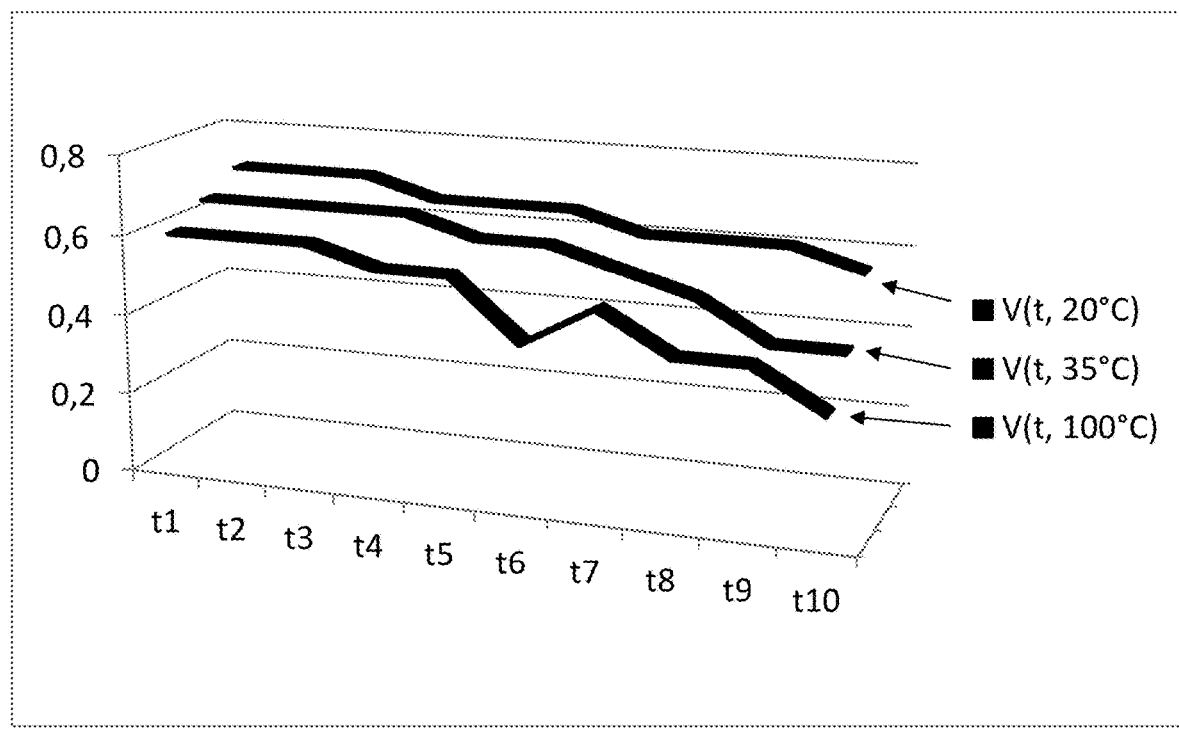
FIG. 5 illustrates three exemplary characteristic curves for the transmission quality of the system determined according to the transmission quality measure from an extent of the subrange for three different values of the operating parameter "temperature" under some aspects of the present disclosure.

Based on these determined operating points, a selected extent V(t) of the subrange T(t) is now determined in step 235 as a measure of the transmission quality at measurement time t. Accordingly, said transmission quality measure is defined by the selected type of extension. In FIG. 3, four different transmission quality measures corresponding to four different types of extension are illustrated. A first transmission quality measure A1 may be defined as an extent measure, which measures at least approximately the two-dimensional extent, i.e. the area, of the subrange T(t). In particular, this can be based on the absolute number or the relative number, relative to a total number of working samples in the operating range B, of operating points WP or i located in the subrange T(t). A second transmission quality measure A2, on the other hand, can be defined as a measure of a one-dimensional extension of the here two-dimensional subrange T(t) along the phase dimension Φ. Similarly, a third transmission quality measure A3 may be defined as a measure of a one-dimensional extent of the subrange T(t) along the level dimension U. An equally exemplary fourth transmission quality measure A4 may be defined as a measure of a one-dimensional extent of the subrange T(t) along an extension direction defined by a linear combination of the two dimensions Φ and U (more precisely, of vectors directed along these dimensions) and thus extending obliquely through the subrange T(t). The respective one-dimensional extension can run in particular, as illustrated for the dimensions A2 and A3, between the opposite outer boundaries of the subrange T(t), or, as illustrated for the dimension A4, scan be defined as starting from a selected point, in particular from a coordinate origin, in the subrange T(t) only at the other end by such a boundary and thus position-dependent.

The transmission quality measure can in particular also be defined as a relative measure in some examples. This can be achieved in particular by relating the specific extent of the subrange T(t) approximately (i) to the corresponding total extent of the operating parameter range B (cf. FIGS. 4 and 5) or (ii) to the corresponding original extent of the subrange T(t) at the initial time t1.

Then, in a step 240, the reference value R(t) assigned to the current measurement time t is read from the lookup table LUT of the memory device 130 and, in a further step 245, a comparison of the determined extent V(t) of the subrange T(t) with the read reference value R(t) is performed by means of difference formation. The difference A(t)=V(t)−R(t) determined in this process represents a deviation of the extent V(t) from the reference value R(t) (cf. FIG. 4), which can be used as a measure of the remaining reliability of the system 100a or 100b, respectively. For this purpose, this deviation A(t) is checked in a step 250 according to the test criterion P(t) assigned to the current measurement time t. The test criterion P(t) can be used in particular as a measure of the remaining reliability of the system 100a or 100b, respectively. The test criterion can in particular be defined in such a way that it defines a minimum threshold for the deviation A(t), so that values for the deviation A(t) above this minimum threshold result in sufficient reliability, while values below this minimum threshold indicate a lack of reliability.

According to the result of the test, the value of a reliability indicator Z(t) is then set in step 255 in the case of insufficient reliability (250—no) or in step 260 in the case of sufficient reliability (250—yes) to a value indicating the test result, for example to a correspondingly defined Boolean value "0" or "1".

In case of an optional use (not explicitly shown in FIG. 2) of two or more of the transmission paths L1 to L3 within the scope of the method, its robustness can be further increased in particular by performing the aforementioned steps in each case for each of the transmission paths involved and determining a resulting reliability indicator at the respective measurement time for the electronic system as a whole or for at least one of the transmission paths involved as a function of the reliability indicator determined for the transmission path(s) of the first subset for the respective measurement time and the further reliability indicator determined for this respective measurement time for the transmission path(s) of the second subset. The resulting reliability indicator can be determined in particular on the basis of a comparison, a correlation test or a similarity test by means of a similarity measure.

In particular, it is thus possible in many cases to distinguish system-internal defects or faults which have their cause in a transmission path or one or more components of the system itself from faults which have an external cause and occur, for example, by means of electromagnetic coupling of interference signals, in particular only temporarily. Such a distinction is possible in particular if the reliability curve with respect to the two or more different transmission paths is clearly different, so that it can be assumed that a first subset of the transmission paths is subject to an external disturbance, while this is not the case for the second subset of the transmission paths formed by the other transmission path.

In the case of step 260, the method then immediately branches back to step 210, while in the case of step 255, this is preceded by step 265, in which a predetermined action, for example error signaling, is triggered.

Further examples describing aspects of the present disclosure are described further below:

By using communication interfaces and corresponding protocols, data packets in particular can be transmitted between chipsets via the transmission path(s) involved in the method and thus these systems can be monitored with regard to the effects of material aging under automotive loads.

Furthermore, according to one embodiment, the look-up table can already be stored on the assembly during assembly production in a reference module, for example by means of a programming step in a memory device designed as an NVM or e-Fuse.

In another embodiment, the determination of the look-up table may include signal levels, phases, or temperature and aging dependent BER expectation values that are determined based on experience based on the assembly operating concept, in particular using a statistical design of experiments (DoE)—"Shmoo Diagram".

Other possible embodiments are listed below:

1. A method for detecting at least one characteristic of an electronic component, the electronic component being determined to be used in a vehicle, on a vehicle or in services for a vehicle, the method comprising providing a communication interface for transmitting data relating to the electronic component to be examined
2. The method according to embodiment 1, wherein the method is used to monitor error-free transmission of data packets transmitted between chipsets by using one or a plurality of communication interfaces, in particular fast communication interfaces, and corresponding protocols.
3. The method according to embodiment 1 or embodiment 2, wherein, as part of a build-in self-test, a bit error rate test (BERT) is repeatedly performed at the respective signal operating point and is compared with the BER values in a look-up table, wherein, if the mean value of the repeated BERT deviates from the BER values in the look-up table, the signal quality has changed.
4. The method according to at least one of embodiments 1 to 3, wherein the look-up table has a signal level and phase dependent BER expectation values representing specification and intervention limits, wherein in particular these expectation values are clustered according to temperature and aging condition.
5. The method according to at least one of embodiments 1 to 4, further comprising storing expected values on an assembly.
6. The method according to at least one of embodiments 1 to 5, further comprising storing expected values during assembly production in a memory section of the assembly or module of the assembly.
7. The method according to at least one of embodiments 1 to 6, wherein the look-up table BER expectation values are stored on the assembly during assembly production in a reference module, in particular into an NVM or an e-fuse by means of a programming step.
8. The method according to at least one of embodiments 1 to 7, wherein the values of the look-up table are based on an assembly operation concept.
9. The method according to at least one of embodiments 1 to 8, wherein the values of the look-up table are based on a static experimental design, in particular on a Shmoo diagram.
10. The method according to at least one of embodiments 1 to 9, wherein the determination of the look-up table signal levels, phases, temperature and aging dependent BER expectation values are determined experience-based based on the assembly operating concept (SW), or by means of a statistical design of experiments (DoE)—"Shmoo Diagram".
11. The method according to at least one of embodiments 1 to 10, wherein the method is applied to an apparatus of a vehicle component.
12. A device for carrying out the method according to at least one of embodiments 1 to 11, comprising a test device suitable for testing components of the automotive industry.

The present solution is applicable, among other things, to control units, sensors, as well as modules. The application of the method and device according to the present disclosure can be made wherever complex or special functions are used based on semiconductor/electronic products.

Depending on the respective interface specification (e.g. PCIe Gen1/2, eSATA, USB) for the communication interfaces involved in the signal transmission, specified variance ranges exist for the signals to be transmitted for the signal levels and phases. During DoE, signal operating points (level, phase, temperature, different pre-aging of the mounting and interconnect technology) are set in the specified variance range and a BERT is repeatedly performed. Resulting Shmoo eye diagrams correlate to the operating points—specification and intervention limits (reference value or value curves) can thus be derived.

As an example, the "PCIe" interface is used here to further explain the present disclosure and the advantages that can be achieved with it. PCI Express ("Peripheral Component Interconnect Express", abbreviated PCIe or PCI-E) is a standard for connecting peripheral devices to the chipset of a main processor and provides a high data transfer rate per pin. The PCI Express protocol contains a very robust connection integrity scheme, but has some reliability limitations that are not immediately obvious. Each application packet contains a link-level cyclic redundancy check (LCRC) that is verified immediately upon receipt. An acknowledged/not acknowledged (ACK/NAK) mechanism handles the seamless retransmission of faulty packets and includes timeouts to ensure that broken connections do not go unnoticed.

However, one potential limitation is that the LCRC can only protect the data that is actually presented to the PCI Express interface logic—it does not provide a way to confirm that the data is actually correct. Additionally, retransmission of erroneous packets due to lack of acknowledgement (Not-Acknowledged/NAK) hides signal integrity issues in the physical link, as application software and even upper layer hardware are less likely to be aware of the retransmissions. Thus, whether due to a fundamental problem that occurs at design/manufacturing time, or due to aging, all but the most serious PCI Express link errors will be largely invisible to software.

Thus, an advantageous field for improvements in PCIe achievable according to the present disclosure is in tracking reliability from the perspective of initial error-free transmission. For example, if each packet requires three attempts for successful delivery, the link may be reliable in the sense of correct data delivery, but not in the sense of error-free transmissions. Long experience with PCI Express has shown that channels with poor quality are the main source of problems. By means of the solution according to the present disclosure, however, a deteriorating reliability of the PCIe transmission and thus of the electronic system involved can be detected at an early stage, and this at a time when no functional faults are yet occurring and thus the looming deterioration in reliability could not yet be detected by conventional means.

Overall, there are also the following advantages according to the present disclosure, among others: The cost-intensive assurance of the functional safety of modern assemblies and other electronic systems can be significantly improved. In particular, the degree of innovation of corresponding products actually used in products can be increased in applications that are particularly demanding in terms of reliability, such as in automotive engineering or aircraft technology, since an additional monitoring and thus control component can be implemented according to the present disclosure that did not previously exist. Thus, highly innovative products can also be used at the given time without violating reliability requirements.

It also provides an alternative to redundancy concepts in terms of cost, weight, and energy.

While at least one exemplary embodiment has been described above, it should be noted that a large number of variations thereon exist. It should also be noted that the exemplary embodiments described are only non-limiting examples, and it is not intended thereby to limit the scope, applicability, or configuration of the devices and methods described herein. Rather, the foregoing description will provide guidance to those skilled in the art for implementing at least one exemplary embodiment, it being understood that various changes in the operation and arrangement of the elements described in an exemplary embodiment may be made without departing from the subject matter set forth in each of the appended claims as well as its legal equivalents.

REFERENCE LIST 100a, electronic system
105 first semiconductor circuit, at the same time device
110 second semiconductor circuit
115, 120 communication interfaces
125 processor
130 storage device
200 exemplary embodiment of the method
202-265 steps of method 200
A, A1, A4 various extensions of the subrange T
B operating parameter range
BER bit error rate
C Transition range
D minimum operating range for proper operation
F fault threshold
I index for indexing the operating points WP
K electronic component
L1, . . . , L3 transmission lines
LUT look-up table
P test criterion
R reference value
T subrange
t1, . . . , t10 different measurement times
t index for indexing the measurement times
U signal level
Φ signal phase
V transmission quality
WP operating point(s) in the operating parameter range
Z reliability indicator

The invention claimed is:

1. A method for monitoring the reliability of an electronic system, comprising:
   measuring, at different measurement times, and according to a predetermined transmission quality measure, a transmission quality of electrical signals transmitted to or from the electronic system over a wired electrical signal transmission path;
   comparing, for each of the measurement times, the associated measured transmission quality with a respective associated transmission quality reference value previously determined according to the transmission quality measure; and
   determining a value of a reliability indicator associated with the respective measurement time in dependence on the result of the associated comparison;
   wherein the transmission quality measure comprises a measure of an extent of a subrange of a one- or multi-dimensional operating parameter range of the electronic system in which, according to a predetermined reliability criterion, the electronic system is configured to reliably operate.

2. The method according to claim 1, wherein the transmission quality measure comprises one of
   (a) the one-dimensional operating parameter range as a function of at least one of (i) an extent of the subrange within the operating parameter range, and/or (ii) a ratio of an extent of a subrange within the operating parameter range to a specified maximum extent of the operating parameter range;
   (b) a multidimensional operating parameter range, as a function of at least one of
      (i) the ratio of an at least two-dimensional extent of the subrange to a corresponding specified extent of the entire operating parameter range or a defined section thereof,
      (ii) an extent of the sub-range along an extension direction determined by a selected single dimension of the operating parameter range or along an extension direction determined by a linear combination of a plurality of its dimensions, and/or
      (iii) a ratio of an extent of the subrange along an extension direction determined by a selected single dimension or along an extension direction determined by a linear combination of multiple dimensions of the operating parameter range to a specified maximum extent of the operating parameter range along that extension direction; or
   (c) a function of a transmission quality measured for one or more selected individual operating points within the operating range or a predetermined section thereof in each case and is evaluated in accordance with the predetermined reliability criterion.

3. The method according to claim 1, wherein the transmission quality measure further comprises a function of at least one parameter characterizing a location of the subrange within the operating parameter range.

4. The method according to claim 1, wherein the transmission quality is determined via the transmission quality measure as a function of data representing a Shmoo diagram spanning the operating range and the subrange therein.

5. The method according to claim 4, wherein the transmission quality to be measured for the respective measurement time is determined as a function of the value of at least one parameter representing a determined extent of the subrange within the Shmoo diagram.

6. The method according to claim 1, wherein:
for each measurement time, the respective measurement of the transmission quality comprises measuring a respective transmission error rate with respect to a digital signal transmission over the signal transmission path for a plurality of operating points within the specified multi-dimensional operating parameter range; and
the transmission quality for the respective measurement time is determined on the basis of the associated transmission error rates thus measured.

7. The method according to claim 6, wherein the comparison of the transmission quality measured at a respective measurement time with an assigned respective reference value for the transmission quality determined beforehand in accordance with the transmission quality measure is performed in such a way that the transmission quality measured at the respective measurement time is included in the comparison in the form of a mean value or median value which results from an averaging or median formation on the basis of this measured transmission quality, and at least one transmission quality measured at an earlier measurement time with respect to the transmission path, wherein the transmission qualities having been determined in each case in accordance with the transmission quality measure.

8. The method according to claim 1, wherein each respective reference value associated with one or more measurement times is determined as a function of at least one of the operating parameters.

9. The method according to claim 1, wherein the operating parameter range has, each as a dimension, at least one of the following operating parameters:
(i) an operating parameter characterizing a signal level of a signal transmitted via the transmission path;
(ii) an operating parameter characterizing a signal phase of a signal transmitted via the transmission path;
(iii) an operating parameter characterizing an operating temperature of the electronic system or the transmission path;
(iv) an operating parameter characterizing an aging condition of the electronic system or the transmission path; and/or
(v) an operating parameter that identifies one or more external influences or impacts to which the electronic system is exposed.

10. The method according to claim 1, wherein the reference values for the transmission quality are determined at different measurement times prior to the determination of the subrange under specific reference conditions and are stored in a data structure within a memory device for subsequent comparison with the results of the measurement of the transmission quality.

11. The method according to claim 1, wherein the respective value of the reliability indicator is determined to indicate sufficient reliability or lack of reliability depending on the result of the comparison.

12. The method according to claim 11, wherein the determination of the respective value of the reliability indicator is performed on the basis of a test criterion which is dynamically adapted depending on a plurality of previously determined values of the reliability indicator or of the resulting reliability indicator.

13. The method according to claim 12, wherein the dynamic adaptation of the test criterion is performed in the context of machine learning on the basis of the previously determined values of the reliability indicator or, as the case may be, the resulting reliability indicator.

14. The method according to claim 11, wherein the value of the reliability indicator is determined as a function of a deviation, determined during the comparison, of the respective transmission quality measured according to the transmission quality measure from the associated respective reference value based on one of the following test criteria:
(i) if the determined deviation does not fall below a predetermined fixed value for a minimum deviation, the value of the reliability indicator is set to indicate sufficient reliability and otherwise a lack of reliability;
(ii) if the determined deviation does not fall below a value for the minimum deviation defined as a function of the measurement time, the value of the reliability indicator is set to indicate sufficient reliability and otherwise lack of reliability;
(iii) if the respective measurement time is before the time of reaching a predetermined state of aging of the electronic system, the value of the reliability indicator is set to indicate sufficient reliability and otherwise lack of reliability.

15. The method according to claim 1, wherein at least one electronic component is arranged in the transmission path, and the determination of the transmission quality at the respective measurement time is carried out depending on the type of the at least one component.

16. The method according to claim 1, further comprising:
determining a respective further reliability indicator for the measurement times based on a repeated measurement of the transmission quality according to the predetermined transmission quality measure of signals transmitted to or from the electronic system via a second signal transmission path, different from the first signal transmission path; and
determining a resulting reliability indicator at the respective measurement time for the electronic system or at least one of the transmission paths as a function of the reliability indicator determined for the first transmission path for the respective measurement time and the further reliability indicator determined for this respective measurement time for the second transmission path.

17. The method according to claim 1, further comprising triggering an action of the electronic system itself or an action of another entity acting thereon, when, according to the determined value of the reliability indicator or the resulting reliability indicator, the electronic system is no longer sufficiently reliable.

18. An apparatus for monitoring the reliability of an electronic system, comprising:
a communications interface; and
a processing apparatus, operatively coupled to the communications interface, wherein the processing apparatus is configured to
measure, at different measurement times, and according to a predetermined transmission quality measure, a transmission quality of electrical signals transmitted to or from the electronic system over a wired electrical signal transmission path;
compare, for each of the measurement times, the associated measured transmission quality with a respective associated transmission quality reference value previously determined according to the transmission quality measure; and
determine a value of a reliability indicator associated with the respective measurement time in dependence on the result of the associated comparison;

wherein the transmission quality measure comprises a measure of an extent of a subrange of a one- or multi-dimensional operating parameter range of the electronic system in which, according to a predetermined reliability criterion, the electronic system is configured to reliably operate.

19. A computer program comprising instructions that, when executed on one or more processors associated with an apparatus, cause the apparatus to:

measure, at different measurement times, and according to a predetermined transmission quality measure, a transmission quality of electrical signals transmitted to or from the electronic system over a wired electrical signal transmission path;

compare, for each of the measurement times, the associated measured transmission quality with a respective associated transmission quality reference value previously determined according to the transmission quality measure; and determine a value of a reliability indicator associated with the respective measurement time in dependence on the result of the associated comparison;

wherein the transmission quality measure comprises a measure of an extent of a subrange of a one- or multi-dimensional operating parameter range of the electronic system in which, according to a predetermined reliability criterion, the electronic system is configured to reliably operate.

* * * * *